United States Patent [19]

Young

[11] Patent Number: 4,496,648
[45] Date of Patent: * Jan. 29, 1985

[54] METHOD OF MAKING HIGH RELIABILITY LEAD-ALLOY JOSEPHSON JUNCTION

[75] Inventor: Peter L. Young, North Wales, Pa.

[73] Assignee: Sperry Corporation, New York, N.Y.

[*] Notice: The portion of the term of this patent subsequent to Sep. 20, 2000 has been disclaimed.

[21] Appl. No.: 362,568

[22] Filed: Mar. 26, 1982

[51] Int. Cl.$^3$ .................... H01L 39/22; H01L 39/24
[52] U.S. Cl. .................... 430/312; 430/315; 430/319; 427/63; 427/99; 427/250; 427/255.1; 427/255.7; 427/259; 427/282; 427/383.3; 427/404
[58] Field of Search ............. 427/63, 250, 255, 255.1, 427/255.7, 99, 282, 38, 39, 383.3, 404, 259; 204/192 N; 430/312, 315, 319

[56] References Cited

U.S. PATENT DOCUMENTS

| | | | |
|---|---|---|---|
| 3,756,193 | 9/1973 | Carmichael et al. | 204/192 N |
| 3,900,585 | 8/1975 | Matsubara | 204/192 N |
| 3,912,826 | 10/1975 | Kennedy | 204/192 N |
| 4,015,558 | 4/1977 | Small | 118/729 |
| 4,024,041 | 5/1977 | Hanazono et al. | 204/192 N |
| 4,129,167 | 12/1978 | Sigsbee | 427/250 |
| 4,405,658 | 9/1983 | Young | 427/63 |

OTHER PUBLICATIONS

Ames, IBM J. Res. Develop., vol. 24, No. 2, Mar. 1980, pp. 188-194.
Greiner et al., IBM J. Res. Develop., vol. 24, No. 2, Mar. 1980, pp. 195-205.
Yamada et al., J. Vac. Technol., vol. 16, No. 3, May 1979, pp. 875-877.
Lahiri et al., J. Appl. Phys., vol. 49, No. 5, May 1978, pp. 2880-2884.
Forster et al., IBM Tech. Dis. Bul., vol. 18, No. 8, Jan. 1978, p. 2646.
Raider et al., IEE Transactions on Magnetics, vol. Mag-17, No. 1, Jan. 1981, pp. 299-302.
Carpenter, *Ion Plating: How to Make Films Stick*, Compon. Technol. (GB), vol. 4, No. 6 (Feb. 1971), pp. 17-22.
Kennedy et al., *Gas Scattering and Ion-Plating Deposition Methods*, Research/Development, vol. 22, No. 11 (Nov. 1971), pp. 40 to 44.
Goode et al., *Ion Plating*, Vacuum, vol. 29, No. 1, (Jan. 1979), pp. 9-17.
Silvestri, IBM Tech. Dis. Bul., vol. 21, No. 1, Jun. 1978, p. 396.

Primary Examiner—Richard Bueker
Attorney, Agent, or Firm—John B. Sowell; Thomas J. Scott; Marshall M. Truex

[57] ABSTRACT

During the preparation of a Josephson junction device, one of the steps for making a base electrode is to deposit a superconducting material on a substrate and to anneal the deposited material to make it a continuous homogeneous polycrystalline grain-like electrode material. Ordinarily, the base electrode and the counter electrode materials are deposited in a vacuum system at a vacuum pressure which is below one $\times 10^{-6}$ torr to remove all contaminants such as oxygen, oxides of carbon and water vapor. It has been discovered that depositing conventional superconducting base electrode and counter electrode materials in the presence of an inert gas at much high vacuum pressures around $20 \times 10 - 3$ torr produce a superior lead-gold superconductive electrode which is substantially immune to thermal cycling.

16 Claims, 7 Drawing Figures

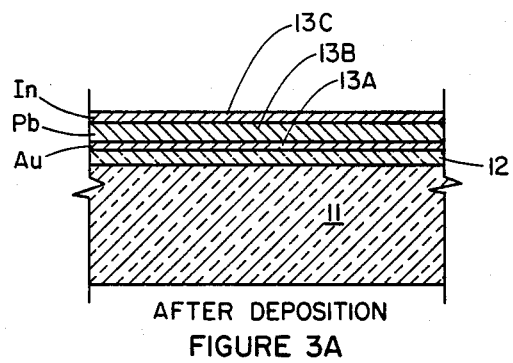
FIGURE 3A — AFTER DEPOSITION
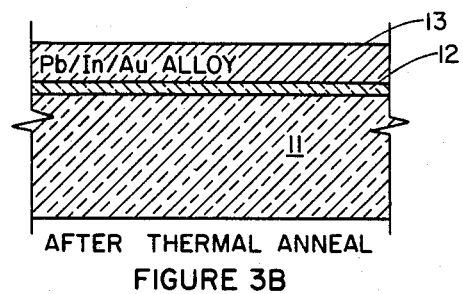
FIGURE 3B — AFTER THERMAL ANNEAL
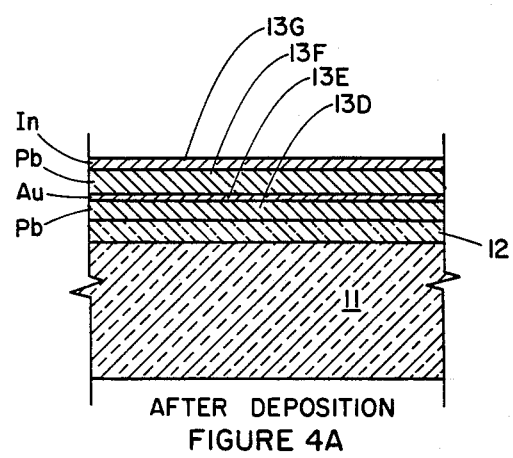
FIGURE 4A — AFTER DEPOSITION
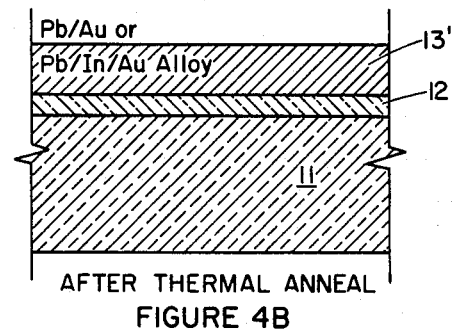
FIGURE 4B — AFTER THERMAL ANNEAL
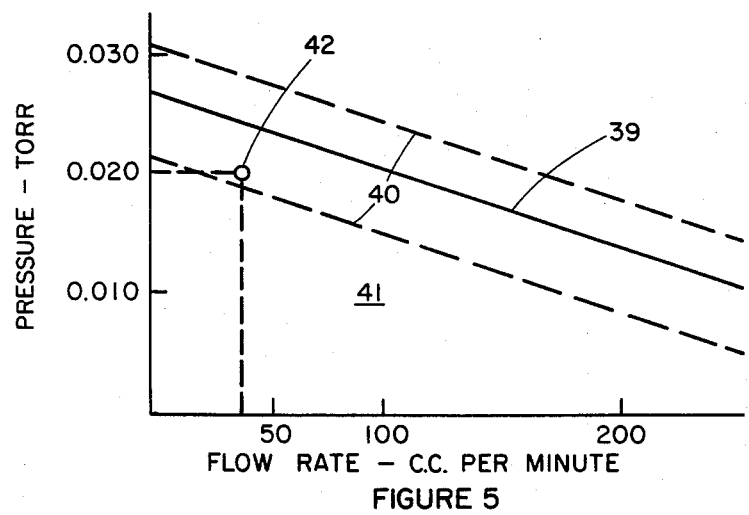
FIGURE 5

1

METHOD OF MAKING HIGH RELIABILITY LEAD-ALLOY JOSEPHSON JUNCTION

BACKGROUND OF THE INVENTION

1. Field of the Invention

This invention relates to a new method of making superconducting lead-alloy Josephson junctions. More particularly, this invention relates to a method of making lead-alloy based electrodes for Josephson junction devices which exhibit a high degree of thermal cyclability.

2. Description of the Prior Art

Numerous papers have been published concerning problems that arise during fabrication and use of lead-alloy for Josephson tunnel junction devices. Lead-alloy-based Josephson devices are described as being weak and subject to degradation when exposed to thermal cycling between their supercool operating environment temperature and room temperature. Lead-alloy-based Josephson devices are also described as being prone to failure when annealed at temperatures in excess of around seventy degrees centigrade even though proper processing of Josephson junction devices exposes the wafers to steps which are best performed at temperatures in excess of seventy-five degrees centigrade.

The underlying problem arises from the deposited lead and lead-alloy material used in making the electrodes of the Josephson junction device. The layers are first deposited as discrete metal layers in laminate form. Then the layers are interdiffused and annealed at elevated temperatures to provide a homogeneous alloy having distinctive polycrystalline grain-like structure. Thermal cycling of this grain-like structure results in growth of the grains in the electrode material. In Josephson junction devices, the very thin tunnel barrier is formed intermediate the base electrode and the counter electrode. The enlargement of the grains of the base electrode or counter electrode are known to cause penetration of the very thin tunnel barrier which results in failure of the Josephson junction devices.

H. C. Ward Huang, et al described in the IEEE Transactions on Electron Devices at volume Ed-27, number 10 October, 1980 at pages 1979 to 1987 a process for making lead-indium-gold alloy base electrodes that exhibit improved thermal cycling stability. In the preferred method described in this article, the base electrode materials are deposited at seventy-seven degrees Kelvin to produce a fine-grain structure.

Josephson junction devices are operated at or near four degrees Kelvin. Circuits embodying Josephson junction devices are repaired and maintained at room temperatures around three hundred degrees Kelvin. In the preferred method of making Josephson junction devices, process temperatures in the range of three hundred and seventy degrees Kelvin can be encountered. Presently, thermal cycling of Josephson junction lead-alloy based electrodes between operating temperatures and room temperatures and/or process temperatures has lead to high rejection rates of Josephson junction devices as a result of the production process and further have resulted in premature failure of acceptable devices due to thermal cycling.

Presently, Josephson junction devices are produced at relatively low temperatures because it is known that evaporation of lead at pressures less than $10^{-7}$ torr produce a desirable fine-grain deposited structure. At pressures less than $10^{-7}$ torr, most of the oxygen, oxides of carbon and water vapor are removed so that the grains are free of oxides which would enlarge the grain size.

Metals such as zinc, aluminum and manganese, etc. have been vapor deposited as particles in inert gas environments in order to study homogeneous nucleation and the effect of atmospheric polution. These studies were concerned with particle size and the growth of particles but were not concerned with controlling grain size or producing superconducting layers for Josephson junction devices.

It is known that abnormal size grains or large grains of superconducting base electrode material of Josephson junction devices tend to enlarge when thermally cycled and inevitably result in penetrating the tunnel barrier formed on top of the base electrode material.

It would be desirable to produce a lead-alloy based electrode material for Josephson junction devices which is substantially immune to thermal cycling and which can be made at room temperatures and which can be processed at temperatures well in excess of seventy-five degrees centigrade (348 degrees Kelvin).

SUMMARY OF THE INVENTION

It is a principal object of the present invention to provide a novel method of making lead-alloy electrodes for Josephson junction devices.

It is another principal object of the present invention to provide a method of making lead-alloy electrodes for Josephson junction devices which are immune to thermal cycling between operational temperatures and room temperatures.

It is yet another principal object of the present invention to provide a method of making lead-alloy electrodes for Josephson junction devices which exhibit no observable grain growth when annealed to one hundred twenty-five degrees centigrade in air and/or to two hundred fifty degrees centigrade in a vacuum environment.

It is yet another object of the present invention to provide a novel method of producing fine-grain lead-alloy electrode material for Josephson junction devices.

It is a general object of the present invention to provide a novel method of producing fine-grain lead-alloy electrode material for Josephson junction devices at substrate temperatures heretofore considered improper.

It is another general object of the present invention to provide a novel method of producing fine-grain lead-alloy electrode material for Josephson junction devices at higher pressures than heretofore considered proper.

It is a general object of the present invention to provide a method of making lead-alloy electrodes for Josephson junctions that are reliable enough for use in computers.

According to these and other objects of the present invention, a silicone substrate wafer is placed in a vacuum bell jar system and the vacuum pressure is reduced below one $\times 10^{-6}$ torr. An inert gas is metered into the vacuum chamber of the vacuum system to increase the vacuum pressure to approximately twenty $\times 10^{-3}$ torr. The dynamic vacuum system is then maintained at approximately twenty $\times 10^{-3}$ torr by continuously introducing inert gas at a predetermined flow rate while the layers of lead-gold and another superconductive metal are deposited to form an electrode. The deposited layers are then interdiffused to provide a homogeneous polycrystalline grain-like electrode material which is immune to thermal cycling.

BRIEF DESCRIPTION OF THE DRAWINGS

FIG. 3A is an enlarged schematic cross-sectional view of a portion of the as deposited base electrode material of FIG. 1;

FIG. 3B is an enlarged schematic cross-sectional view of the base electrode material of FIG. 3A after annealing;

FIG. 4A is an enlarged schematic cross-sectional view of a portion of another as deposited base electrode material;

FIG. 4B is an enlarged schematic cross-sectional view of the base electrode material of FIG. 4A after annealing; and FIG. 5 is a graph of pressure vs. flow rate of inert gas employed while depositing the electrode material layers shown in FIGS. 3A and 4A.

DESCRIPTION OF THE PREFERRED EMBODIMENT

The term Josephson junction as used in this application shall mean any two superconducting electrodes separated by a very thin oxide tunnel barrier and operating near four degrees Kelvin in temperature. The Josephson junction is capable of conducting a critical amount of current $I_0$ without a voltage drop before developing a voltage across the electrodes.

Figure 1:
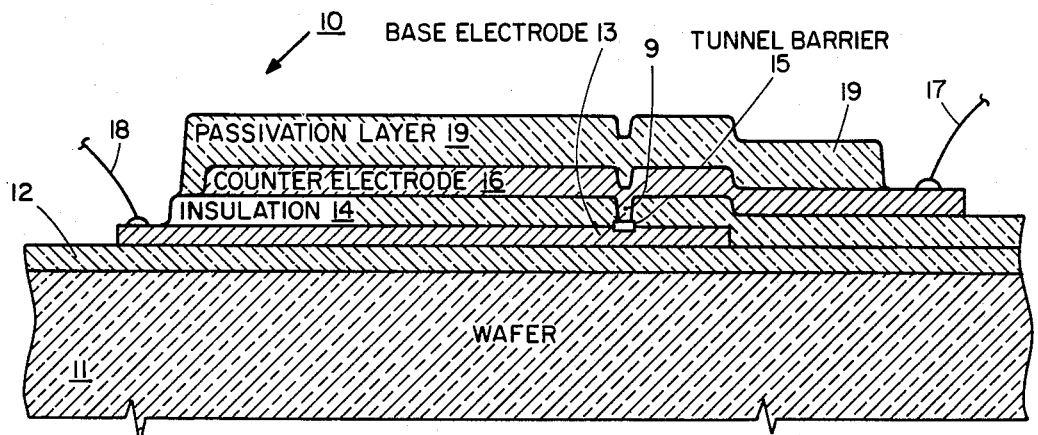
FIG. 1 is a schematic cross-sectional view of a typical Josephson junction.

Refer to FIG. 1 showing a cross-section of a typical Josephson junction used for test purposes. A plurality of such single Josephson junction devices may be made on a substrate wafer for the purposes of testing the Josephson junction and the materials which form the base electrode, the counter electrode and the tunnel barrier materials. The typical Josephson junction shown is but one of many of such Josephson junctions that would be made on a flat surface such as a silicon wafer to form an integrated circuit using well known semiconductor processing techniques. The Josephson junction 10 comprises a standard silicon wafer 11 which has been cut and polished for use in the manufacture of semiconductor devices. The standard silicon wafer 11 is approximately 13 mils thick and has a thermally grown silicon dioxide ($SiO_2$) layer 12 formed thereon in a standard diffusion furnace. The silicon wafer 11 and the isolation layer 12 form a substrate which is placed in a vacuum chamber for the vacuum evaporation and deposition of the layers which are built up to form the Josephson junction. Once the substrate 11, 12 is in the vacuum chamber a series of layers shown as base electrode 13 are formed thereon from a layer of lead, a layer of gold and a second layer of some form of superconducting metal as will be explained in detail hereinafter. The partially completed junction 10 is removed from the vacuum chamber and a photoresist mask pattern is applied to the now exposed layers 12 and 13. After the proper photoresist lift-off stencil is applied to the partially complete junction 10, it is returned to the vacuum chamber where a silicon oxide insulation layer 14 is applied over the lift-off stencil. When the substrate is again removed from the vacuum chamber, the photoresist may be removed by standard techniques leaving an aperture or window 9 in portions of silicon oxide insulation layer 14. Before returning the partially complete Josephson junction 10 to the vacuum chamber, a second photoresist lift-off stencil may be applied which defines the location of the counter electrode. After the partially complete device is now returned to the vacuum chamber, the lead oxide and indium oxide tunnel barrier 15 may be formed by radio frequency oxidation which is a well known technique. The tunnel barrier 15 is approximately fifty angstroms thick and is partially embedded in the base electrode 13 and partially grown above the base electrode 13. For purposes of this experimental test junction, the silicon oxide insulation layer 14 may be approximately 3000 angstroms thick. While still in the vacuum chamber, a second electrode or counterelectrode 16 may be formed on top of the insulation layer 14 and the tunnel barrier 15. The partially complete Josephson junction 10 is now removed from the vacuum furnace and the lift-off photoresist is stripped away by emersing it in acetone leaving exposed the areas of the counterelectrode 16 to which a lead or wire 17 is attached. A second wire lead 18 may now be attached to the base electrode 13 to form a complete circuit through the tunnel barrier 15. If the Josephson junction 10 is only to be used for a limited number of tests, it is not necessary to form a silicon oxide passivation layer 19 on top of the counter electrode to form an insulation and protective layer. The counter electrode 16 is approximately 3000 angstroms thick and the protective layer 19 is approximately 5000 angstroms thick. The lead wires 17 and 18 may be attached with a standard semiconductor wire bonding machine and do not require additional explanation at this point. It will be understood that the base electrode 13 comprises a plurality of individual layers of metals which are annealed to form a homogeneous polycrystalline grain structure which will be defined in more detail hereinafter. Further, it will be understood that the same materials and same techniques employed to make the base electrode 13 may be employed to make the counter electrode 16. However, it is not necessary that the counter electrode 16 be made from the same materials as the base electrode 13. For example, if indium is used as one of the superconductors in the base electrode 13, it is not necessary to use indium in the counter electrode 16. Use of indium in the counter electrode could induce current variation under long term storage conditions because it can diffuse into the tunnel barrier 15. The indium that was used in the base electrode 13 in order to supply the proper material for the tunnel barrier 15 is not required in the counter electrode 16.

Figure 2:
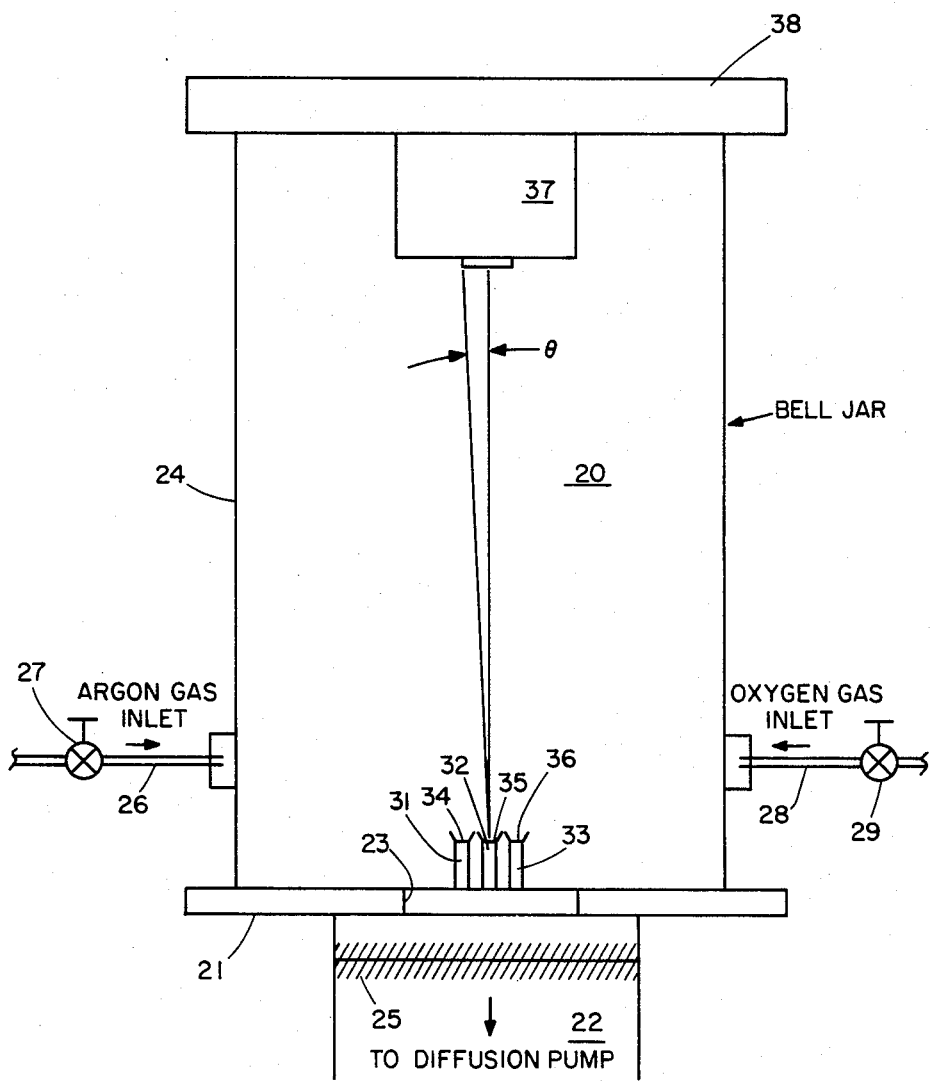
FIG. 2 is a schematic cross-sectional view of a vacuum bell jar system used to deposit the Josephson junction layers shown in FIG. 1.

Refer now to FIG. 2 showing a schematic representation of a vacuum bell jar system 20. The vacuum system 20 comprises a base plate 21 having a diffusion pump 22 which is preferably bolted to the base plate and sealed to the bottom surface thereof. An aperture 23 in the base plate 21 connects the diffusion pump 22 to the bell jar 24 to provide a vacuum therein. The diffusion pump is of the type which is provided with a variable orifice adjustment 25. Also, connected to the bell jar 24 is a valve inlet 26 for providing inert gas to the vacuum chamber. A flow control valve 27 is provided at the inlet 26 to permit a predetermined flow of inert gas to the vacuum system 20. A second inlet 28 and control valve 29 are shown attached to bell jar 24 to permit the introduction of other gases such as oxygen which are used in the process. Supported on top of base plate 21 are shown three thermal evaporation systems 31, 32 and 33. These thermal evaporation systems support standard tungsten boats 34, 35 and 36 into which the metals to be evaporated are placed. In the present embodiment, the boats 34, 35 and 36 are placed as near as possible opposite the substrate 11, 12 described hereinabove with respect to FIG. 1. It is desirable that the angle theta ($\theta$) which defines the angle at which the metals impinge or deposit upon the substrate does not exceed approximately five degrees. Metal housing 37 provides support for a radio frequency cathode which is employed to produce a radio frequency oxidation of the base electrode 13 to produce the afore-mentioned tunnel barrier 15. In the preferred embodiment shown, a stainless steel plate 38 is employed to form the top seal for bell jar 24.

In the preferred embodiment process of the present invention, the three tungsten boats 34, 35 and 36 are filled with the metals to be used to form the base electrode 13 and the counter electrode 16. During the complete process described hereinbefore, the tungsten boats 20 may be left in the vacuum chamber 20 until the Josephson junction 10 is completed. The top plate 38 may be raised to provide access to the substrate 11, 12 during the processes which require its removal in order to apply the lift-off photoresist stencil and to dissolve the lift-off photoresist stencil.

Refer now to FIG. 3A showing an enlarged schematic cross-sectional view of a portion of the as deposited base electrode material. The substrate 11, 12 comprises the silicon wafer 11 and the thermally grown silicon oxide insulation layer 12. This substrate 11, 12 is positioned opposite the tungsten boats 34, 35 and 36 which in this preferred embodiment contain respectively gold, lead and indium. In three successive thermal evaporation steps the gold is first evaporation deposited as a layer 13A approximately forty-eight angstroms thick. In the next sequential step, a layer of lead 13B is deposited on top of the gold approximately sixteen hundred angstroms thick. Then, on top of the lead layer 13B an indium layer 13C approximately three hundred and fifty angstroms thick is deposited thereon. After the thermal evaporation system completes its cycle of depositing the layers 13A, 13B and 13C on the substrate 11, 12, it may now be annealed inside of the vacuum chamber using a heater, not shown, inside of housing 38. Such heaters usually comprise tubing which circulates hot water and does not require further information at this point. Employing the heating coils, not shown, in housing 37 the structure shown in FIG. 3 is annealed at a temperature of sixty degrees centigrade at a partial oxygen pressure of 20 m torr for approximately thirty minutes which produces a homogeneous polycrystalline alloy of lead, indium and gold as shown in FIG. 3B. Examination of the homogeneous polycrystalline grain structure of layer 13 reveals that at a magnification of 1000× under a microscope a smooth and grainless surface is observed. Examining the polycrystalline based electrode material 13 under a scanning electron microscope at a magnification of 50,000× reveals that the surface structure of base electrode material 13 is not completely smooth but has a homogeneous and entirely consistant and regular root mean square (RMS) appearance surface. At 50,000× magnification, it is impossible to distinguish individual grains in the surface of the base electrode material 13. However, it is possible to measure the diameter of the individual undulations and raised shapes which do not exceed seven hundred and fifty angstroms in diameter. The same lead-indium-gold alloy base electrode material was applied to a substrate 11, 12 using prior art techniques. Examination of the surface of the prior art based electrode material revealed irregular combined grain-like structures having diameters up to and exceeding five thousand angstroms. In the comparison test, the base electrode material 13 was processed at temperatures which exceeded one hundred and twenty-five degrees centigrade for thirty minutes. At the elevated annealing temperature of one hundred and twenty-five degrees centigrade, no observable change was made in the base electrode material using the present invention method. Using the prior art method of producing the base electrode material 13 blisters were easily observed using the 1000× microscope. Thus, it can be concluded that the grain structure of the base electrode material employing the present invention will easily permit process steps which exceed seventy-five degrees centigrade without any effect on the stability or growth of the grain size of the base electrode material.

Refer now to FIGS. 2, 3A and 3B. In the prior art process, the base electrode material was made by pumping the vacuum system 20 down to below $10^{-6}$ torr before depositing the afore-mentioned layers 13A, 13B and 13C at four degrees centigrade. When this base electrode material was formed as the structure shown in FIG. 3A, it was observed that the granular structure was undesirable for use as a Josephson junction electrode. Using the present invention method, the vacuum system 20 was pumped down to below one $\times 10^{-6}$ torr and before depositing the afore-mentioned layers 13A, 13B and 13C argon inert gas was introduced via inlet 26 into the bell jar 24 to cause the pressure inside the vacuum system 20 to stabilize at 20 m torr. While the inert gas argon was being metered into the vacuum system, the diffusion pump was continuing to stabilize and hold the pressure at approximately 20 m torr. At this increased pressure, the three layers of gold, lead and indium were sequentially evaporatively deposited as layers 13A, 13B and 13C before being annealed at a temperature of approximately sixty degrees centigrade to form the homogeneous polycrystalline fine-grain base electrode material 13. Using the high pressure evaporation technique, with the presence of inert gas, it was discovered that the grain structure is not only extremely fine and completely consistent but is substantially immune if not completely immune to thermal cycling between the temperatures of four degrees Kelvin and approximately three hundred degrees Kelvin which is room temperature.

Four unprotected samples of the base electrode material 13 have been annealed at temperatures much in excess of the standard process temperatures of seventy-five degrees centigrade and no ill-effects were observed on the fine-grain polycrystalline base electrode material 13. Further, the samples of the base electrode material 13 were cycled many times at temperatures which would be representative of normal operation of superconductive Josephson junction devices in operational integrated circuits and no grain growth of any type could be observed. While a preferred inert gas argon was used in the manufacture of the base electrode material 13, it is well known that other noble inert gases such as krypton, xenon, neon and/or helium may be employed in the same manner to produce the same results. While FIGS. 3A and 3B have been employed to explain the manufacture of a base electrode material 13, the same techniques may be employed to manufacture the lead-gold-lead counter electrode 16. Using this technique, sixteen hundred angstroms of lead would be applied on top of the isolation layer 12 and thirty angstroms of gold would be applied on top of the first layer of lead. A second layer of lead approximately sixteen hundred angstroms thick would be applied on top of the gold layer and the three layers annealed as described hereinbefore to produce a homogeneous polycrystalline counter electrode 16. Some experts have contended that it is not necessary to anneal the laminer material layer forming the counter electrode 16, however, tests tend to indicate that it is desirable that the counterelectrode material be annealed to make it completely homogeneous.

Refer now to FIGS. 4A and 4B showing an enlarged schematic cross-sectional view of a portion of the as deposited base electrode material 13 employing a different sequence of layers. The substrate 11, 12 is formed as described hereinbefore and placed on the housing 37 opposite the tungsten boats 34, 35 and 36. After the vacuum chamber 20 has been pumped down to a pressure below one $\times 10^{-6}$ torr, argon inert gas is introduced via inlet 26 into the bell jar 24 to cause the pressure inside the vacuum system 20 to stabilize at 20 m torr. The first layer to be evaporatively deposited on the substrate is a layer of lead 13D approximately four hundred angstroms thick. On top of layer 13D a layer of gold 13E approximately forty-eight angstroms thick is deposited. On top of the layer of gold 13E a second layer of lead 13F approximately twelve hundred angstroms thick is evaporatively deposited. As a final or top layer, a layer of indium 13G approximately three hundred and fifty angstroms thick is deposited thereon. When the four laminar layers 13D to 13G are annealed at approximately sixty degrees centigrade, they interdiffuse to form a homogeneous polycrystalline fine-grain base electrode material 13' as shown in FIG. 4B. It will be noted that the characteristics of the base electrode material 13' may be identical to that shown as material 13 in FIG. 3B by employing the proper ratios of material even though applied to form a laminar layer in a different sequence. If the last and fourth layer 13G of indium is omitted and the lead-gold-lead layer annealed, there results a preferred counter electrode material 16 which does not have the undesirable long term instability associated with the presence of indium in the counter electrode material.

Having explained how the fourth layer of indium 13G may be omitted to provide a lead-gold-lead laminate layer 13D, 13E, 13F for use as a counter electrode 16, it will now be appreciated that other three and four layer combinations of gold and superconducting materials may be employed to make either the base electrode 13 or the counter electrode 16. For example, lead-gold-lead-tin base electrodes may be made using the same four layer techniques. Further, a single layer of lead-bismuth can be deposited from a single tungsten boat containing the desired alloy and when deposited at the higher pressure employed in the present invention in the presence of inert gas, forms a more desirable counter electrode material which is not affected by thermal cycling.

Since one of the new and critical steps in making the extremely desirable grain structure base electrode material is concerned with controlling the pressure of the inert gas during the evaporation deposition of the base electrode materials, it is desirable to now refer to FIG. 5 for an explanation of the flow control. FIG. 5 is a chart which has as an ordinate the pressure of the inert gas as it is controlled inside of the vacuum system 20. The abscissa of FIG. 5 represents the flow rate of the inert gas, preferably argon, which is permitted to flow through and continuously purge the vacuum system 20. As shown by the chart, a pressure range of about (5 to 30)$\times 10^{-3}$ can be utilized. The line 39 of the FIG. 5 chart is representative of a midrange of a boundary 40 of resistivity in which it is desirable to make base electrode material. Below the boundary 40 it was discovered that the base electrode material was not as cycliable as material made within the boundary 40. The region 40 below the line 39 represents an area where the resistivity of the new base electrode material is approximately three to four times the resistivity of the prior art base electrode material which would be made by employing the high vacuum techniques. The closer to the line 39 at which the new base electrode material 13 is made, the closer the resistivity comes to approximately five times the resistivity of the prior art material. Thus, it is desirable to maintain a low flow rate of inert gas and a high pressure to obtain the desirable base electrode material 13. It was found that employing a dynamic pressure of 20 m torr and a flow rate of forty cubic centimeters per minute a consistent resistivity point shown as point 42 could be obtained.

Having explained a preferred embodiment of the present invention employing a method of making a base electrode material and/or a counter electrode material at relatively high pressure in the presence of an inert gas, it will be understood that an extremely desirable base electrode material has been produced which is immune to standard conditions of thermal cyclability. Not only is the new base electrode material immune to thermal cyclability, but it appears to be stable at temperatures up to and including one hundred and twenty-five degrees centigrade which are temperatures much higher than those encountered in any process step which would be desired in producing Josephson junctions.

I claim:

1. A method of producing lead-gold base electrodes for superconducting Josephson junction devices having very high tolerance to thermal cycling, comprising:

providing a substrate wafer, providing a photoresist mask on said substrate wafer, placing said substrate wafer in a vacuum chamber, producing a high vacuum in said chamber to at least $1 \times 10^{-6}$ torr, metering a predetermined amount of inert gas into said vacuum chamber to provide a pressure of approximately (5 to 30)$\times 10^{-3}$ torr in said high vacuum, locating the surface of said substrate wafer approximately normal to the line of sight of metals to be evaporated and deposited thereon, evaporating at least three layers on said substrate in said inert gas while maintaining said inert gas pressure in said chamber, said layers comprising at least one layer of gold and one layer of lead, and a third layer of superconducting metal, annealing said wafer at an elevated temperature to cause interdiffusion of said gold, lead and superconducting metal layers into one layer of fine-grain base electrode material, removing said photoresist mask from said substrate wafer to provide a base electrode having very high tolerance to thermal cycling.

2. A method as set forth in claim 1 wherein the steps of evaporating and depositing the gold, lead and superconducting metal are performed at or near room temperature.

3. A method as set forth in claim 1 wherein said inert gas is argon and the pressure of said argon in said vacuum chamber is held in the range of $(5 \text{ to } 30) \times 10^{-3}$ torr during evaporation and deposition of said layers.

4. A method as set forth in claim 1 wherein said superconducting metal layer is indium deposited last and said gold layer is deposited first.

5. A method as set forth in claim 4 wherein said evaporated and deposited layers of gold, lead and indium are built up to approximately 48Å, 1600Å and 350Å respectively.

6. A method as set forth in claim 1 which further includes a deposited superconducting metal layer of indium deposited as a fourth layer, and the first to third deposited layers are lead, gold and lead respectively.

7. A method as set forth in claim 6 wherein said evaporated and deposited layers of lead, gold, lead and indium are built up to approximately 400Å, 48Å, 1200Å and 350Å respectively.

8. A method as set forth in claim 1 wherein said superconducting metal is lead deposited as a first layer and said gold and said lead layers are deposited sequentially thereon.

9. A method as set forth in claim 8 wherein said evaporated and deposited layers of lead, gold and lead are built up to approximately 1500Å, 30Å and 1500Å respectively.

10. A method as set forth in claim 1 wherein the step of locating said substrate wafer opposite metals to be evaporated and deposited thereon includes the step of restricting the orthogonal line of sight angle of deposition of said metals on said substrate surface to a preferred angle of zero to five degrees from said orthogonal line of sight.

11. A method as set forth in claim 10 wherein said step of restricting said orthogonal line of sight angle of deposition of metals on said substrate wafer does not exceed approximately twenty degrees.

12. A method as set forth in claim 1 wherein said process of producing said fine-grain base electrode layer include steps which require the cycling of said substrate wafer to temperatures in excess of seventy degrees centigrade.

13. A method as set forth in claim 1 which further includes the additional steps of:
  applying a second photoresist layer on top of said base electrode material,
  baking the photoresist layer at temperatures in excess of seventy-five degrees centigrade,
  exposing said photoresist layer to a pattern of ultra violet light applied through a mask,
  developing portions of said exposed photoresist layer to provide a raised lift-off junction photoresist pattern thereon,
  placing said substrate wafer in said vacuum chamber,
  depositing a layer of silicon monoxide on said base electrode and said photoresist lift-off pattern,
  removing said substrate wafer from said vacuum chamber,
  removing said photoresist lift-off junction photoresist pattern,
  applying a third photoresist layer,
  exposing said third photoresist layer to a pattern of ultra violet light,
  developing portions of said third photoresist layer to provide a raised lift-off counter electrode photoresist pattern to provide access to portions of said base electrode material,
  placing said substrate wafer in said vacuum chamber,
  oxidizing said pattern of exposed base electrode material to provide a tunnel barrier junction,
  forming a counter electrode on top of said barrier junction and on portions of said silicon monoxide layer exposed by said counter electrode pattern,
  removing said substrate wafer from said vacuum chamber, and
  removing said counter electrode lift-off pattern to provide a Josephson junction device.

14. A method as set forth in claim 13 wherein the step of forming a counter electrode includes the steps of evaporating successive layers of lead, gold and lead.

15. A method as set forth in claim 14 wherein the step of forming said counter electrode is formed at a high enough temperature to assure interdiffusion simultaneously with deposition.

16. A method as set forth in claim 13 wherein the step of forming a counter electrode includes the steps of evaporating and depositing an alloy of lead and bismuth as a single layer.

* * * * *